(12) United States Patent
Wagner et al.

(10) Patent No.: US 7,345,740 B2
(45) Date of Patent: *Mar. 18, 2008

(54) POLARIZED RADIATION IN LITHOGRAPHIC APPARATUS AND DEVICE MANUFACTURING METHOD

(75) Inventors: Christian Wagner, Eersel (NL); Wilhelmus Petrus De Boeij, Veldhoven (NL); Roel De Jonge, Veldhoven (NL); Tilmann Heil, Aalen (DE); Damian Fiolka, Oberkochen (DE)

(73) Assignee: ASML Netherlands B.V., Veldhoven (NL)

( * ) Notice: Subject to any disclaimer, the term of this patent is extended or adjusted under 35 U.S.C. 154(b) by 167 days.

This patent is subject to a terminal disclaimer.

(21) Appl. No.: 11/101,630

(22) Filed: Apr. 8, 2005

(65) Prior Publication Data

US 2006/0139612 A1    Jun. 29, 2006

Related U.S. Application Data

(63) Continuation-in-part of application No. 11/022,938, filed on Dec. 28, 2004.

(51) Int. Cl.
*G03B 27/72* (2006.01)
(52) U.S. Cl. ................................ 355/71; 355/69
(58) Field of Classification Search ............... 355/30, 355/52, 53, 55, 67–71; 356/399–401; 250/548; 359/489, 738
See application file for complete search history.

(56) References Cited

U.S. PATENT DOCUMENTS

| | | | | |
|---|---|---|---|---|
| 5,459,000 A * | 10/1995 | Unno | ............................. | 430/5 |
| 6,392,800 B2 | 5/2002 | Schuster | | |
| 6,965,484 B2 * | 11/2005 | Shaver | ........................ | 359/738 |
| 6,970,233 B2 * | 11/2005 | Blatchford | .................... | 355/71 |
| 7,084,960 B2 * | 8/2006 | Schenker et al. | ............. | 355/71 |
| 2001/0012154 A1 | 8/2001 | Schuster | | |
| 2001/0019404 A1 | 9/2001 | Schuster et al. | | |
| 2004/0057036 A1 | 3/2004 | Kawashima et al. | | |
| 2005/0128458 A1 * | 6/2005 | Blatchford | .................... | 355/71 |
| 2005/0264885 A1 * | 12/2005 | Albert | ........................ | 359/489 |
| 2006/0092398 A1 * | 5/2006 | McCarthy | .................... | 355/71 |
| 2006/0139611 A1 * | 6/2006 | Wagner et al. | ................. | 355/71 |
| 2006/0146384 A1 * | 7/2006 | Schultz et al. | ................. | 359/9 |

FOREIGN PATENT DOCUMENTS

| | | |
|---|---|---|
| EP | 0 969 327 A2 | 1/2000 |
| JP | 6-124872 | 5/1994 |
| JP | 6-181167 | 6/1994 |
| JP | 2004/111678 | 4/2004 |

OTHER PUBLICATIONS

European Search Report issued in EP 05 25 7710 dated May 11, 2006.
English translation of Korean Office Action issued in Korean Application No. 10-2005-0132116 dated Dec. 8, 2006.

* cited by examiner

*Primary Examiner*—Henry Hung Nguyen
(74) *Attorney, Agent, or Firm*—Pillsbury Winthrop Shaw Pittman LLP

(57) ABSTRACT

A lithographic apparatus uses polarized light to improve the imaging properties such as exposure latitude, while maintaining and extending the lifetime of an illumination system in a lithographic apparatus.

25 Claims, 17 Drawing Sheets

Degree of Polarization (DOP)
=
percent of power (S) in polarized state $$DOP = \frac{S_{Total.Pol}}{\left(S_{Unpol} + S_{Total.Pol}\right)} \times 100\%$$

$$S = S_{Unpol} + S_{Total.Pol}$$

Polarization Purity (PP)
=
percentage of polarized intensity in desired polarization state.

$$PP = \left\| J_{target} \cdot J_{measured} \right\|^2 \times 100\%$$

J denotes the Jones vector describing the polarised electric field

$$J = \begin{pmatrix} E_s e^{i\phi_s} \\ E_p \end{pmatrix}$$

Figure 8

| Polarization Purity / Degree of Polarization | 100% | 50% | 0% |
|---|---|---|---|
| 100% | 100%TE, 0%TM<br>IPS = 1 | 50%TE, 50%TM<br>IPS = 0.5 | 0%TE, 100%TM<br>IPS = 0 |
| 50% | 75%TE, 25%TM<br>IPS = 0.75 | 50%TE, 50%TM<br>IPS = 0.5 | 25%TE, 75%TM<br>IPS = 0.25 |
| 0% | 50%TE, 50%TM<br>IPS = 0.5 | 50%TE, 50%TM<br>IPS = 0.5 | 50%TE, 50%TM<br>IPS = 0.5 |

$$IPS = DoP * (PP - 0.5) + 0.5$$

POLARIZED RADIATION IN LITHOGRAPHIC APPARATUS AND DEVICE MANUFACTURING METHOD

CROSS REFERENCE TO RELATED APPLICATION

This application is a Continuation-In-Part of U.S. application Ser. No. 11/022,938, filed Dec. 28, 2004 which is now allowed, the entire contents of which are incorporated by reference.

BACKGROUND OF THE INVENTION

1. Field of the Invention

The present invention relates to a lithographic apparatus and a method of using the apparatus in the manufacture of a device, for example such as an integrated circuit (IC). In particular, the present invention relates to using polarized light to improve the imaging properties, for example exposure latitude, while maintaining and extending the lifetime of an illumination system in a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

U.S. Pat. No. 6,392,800, which is incorporated herein by reference, discloses an optical arrangement wherein an entering beam is converted into an exiting beam having a total cross section of light which is linearly polarized essentially in the radial direction by rotation.

U.S. Patent Application Publication 2001/0019404 A1, which is incorporated herein by reference, discloses a method and arrangement for microlithographic projection exposure at high aperture which achieves a contrast increase by polarization of light perpendicular to the plane of incidence on the resist.

SUMMARY OF THE INVENTION

It is an aspect of the present invention to maintain and extend the lifetime of an illuminator in a lithographic apparatus.

According to an embodiment of the present invention, a lithographic apparatus includes an illumination system configured to condition a radiation beam; a support constructed to support a patterning device, the patterning device being configured to impart the radiation beam with a pattern in its cross-section to form a patterned radiation beam; a substrate table constructed to hold a substrate; and a projection system configured to project the patterned radiation beam onto a target portion of the substrate, wherein the lithographic apparatus includes an optical active element, the optical active element being capable of providing a first portion of the radiation beam with a linear polarization in the first direction, or being capable of providing a first portion of the radiation beam with a linear polarization in the first direction and being capable of providing a second portion of the radiation beam with a linear polarization in a second direction, the second direction being substantially perpendicular to the first direction.

It has been found that polarizing the radiation beam in a manner according to the present invention maintains and extends the lifetime of an illumination system while using polarized light. The polarized beam in the present invention having portions with a linear polarization in first and second directions, respectively, wherein the first and second directions are mutually perpendicular, is sometimes generally referred to as XY polarized radiation. Reference to XY polarized radiation hereinafter is therefore meant to mean radiation with portions having a linear polarization in the first and second directions, respectively, wherein the first and second directions are mutually perpendicular.

In a lithographic apparatus wherein the substrate table is able to move in a scanning direction with respect to the patterning device, the first direction of polarization may be either parallel or perpendicular to the scanning direction.

Any suitable illumination mode may be used in the illumination system. The illumination modes may have multipole illumination. The poles in the multipole illumination may be chosen to maximize the amount of diffracted radiation within a pupil, whereas the choice of having either X or Y polarized light per pole may maximize the content of TE (i.e. transverse electric) polarization, thus maximizing the contrast.

The illumination mode may be any segmented point-symmetric illumination mode or non-symmetric illumination mode. For example, illumination modes include any of the following: conventional, dipole, a-symmetric, quadrupole, hexa-pole (i.e. six poles) and annular.

Substantially all of the radiation beam is polarized into either the first or second direction modes of polarization. Desirably, at least 95% of the radiation beam is polarized in either the first or second direction. The ratio between the radiation polarized in the first and second direction may depend on polarization properties of the optical device. In general, about 50% of the radiation may be polarized in the first direction and about 50% in the second direction. Alternatively, either the polarization in the first or second directions may dominate.

The optical active element may include two half-wavelength plates.

The half-wavelength plates may be any suitable shape and may preferably be substantially triangular in shape. The half-wavelength plates may be in any of the condensor (CO), adjustor (AD) and/or integrator (IN). Typically, the half-wavelength plates may be both in the condensor (CO), adjustor (AD) and/or integrator (IN). The half-wavelength plates may be in or near the pupil plane of any of the condensor (CO), adjusting device (AD) and/or integrator (IN). Alternatively, there may be one half-wavelength plate in any of the condenser (CO), the adjusting device (AD) and/or the integrator (IN).

The half-wavelength plates may be formed from quartz silica or any other material with intrinsic or externally induced birefringence optical properties at the actinic wavelength. The half-wavelength plates may be oriented such that they impose the required optical polarization rotation onto incident radiation. The rotation of polarization orientation can be based on the physical principles of linear birefringence (half-wavelength plates) or circular birefringence (optical rotary activity).

Linearly birefringent uniaxial crystalline materials are characterized by having a unique axis of symmetry, called the optical axis, which imposes constraints upon the propagation of light beams within the crystal. Two modes are permitted, either as an ordinary beam polarized in a plane normal to the optical axis, or as an extraordinary beam polarized in a plane containing the optical axis. Each of the beams has an associated refractive index, such that both the electric field (wave normal) velocities and the beam (ray) angles of refraction are different. It is this latter property that enables suitably cut and oriented prisms of birefringent materials to act as retarders, rotators, polarizers and polarizing beam splitters.

If a plane polarized beam propagates down the optical axis of a material exhibiting circular birefringence it is resolved into two collinear circularly polarized beams, each propagating with a slightly different velocity. When these two components emerge from the material, they recombine into a plane polarized beam whose plane of polarization is rotated from that of the incident beam. This effect of producing a progressive rotation of the plane of polarization with pathlength is called optical activity, and is used to produce optical rotators.

Typically, imaging properties which may be improved include any of the following: an enhancement in the image contrast, an increment improvement of the exposure latitude, lower mask error enhancement factors (MEEF) and a reduced line-edge roughness.

The lifetime of the illumination system may be extended up to about $30 \times 10^9$ shots (i.e. 30 G shots), about $35 \times 10^9$ shots (i.e. 35 G shots), about $40 \times 10^9$ shots (i.e. 40 G shots) or up to about $110 \times 10^9$ shots (i.e. 110 G shots). Using 45° polarization (i.e. there are two polarizations at 45° to each other) the lifetime of the illuminator may be less than $20 \times 10^9$ shots (i.e. 20 G shots). Desirably, the lifetime of the illumination system may be essentially infinite. Therefore, after a certain number of shots, material forming the illumination system may effectively saturate at a very low induced birefringence.

The lithographic apparatus may include a numerical aperture (NA) greater than about 1.0.

At least part of the lithographic apparatus may be immersed in an immersion fluid such as water.

According to another embodiment of the present invention, a lithographic apparatus includes an optical active element, the optical active element being capable of providing a first portion of the radiation beam with a linear polarization in the first direction, or the optical active element being capable of providing a first portion of the radiation beam with a linear polarization in the first direction and of providing a second portion of the radiation beam with a linear polarization in a second direction, the second direction being substantially perpendicular to the first direction.

In a further embodiment of the present invention, a lithographic apparatus includes an optical active element located between the radiation source and the illuminator, and the lithographic apparatus is provided with a further optical active element located between the illuminator and projection system, the further optical element being capable of changing the polarization state from the first portion of the radiation beam into a different polarization. For example, the further optical active element may include a half-wavelength plate or a quarter-wavelength plate.

According to a yet further embodiment of the present invention a device manufacturing method includes providing a first portion of a radiation beam with a linear polarization in a first direction, or providing a first portion of a radiation beam with a linear polarization in a first direction and providing a second portion of the radiation beam with a linear polarization in a second direction, the second direction being substantially perpendicular to the first direction; patterning the radiation beam; and projecting the patterned beam of radiation onto a target portion of the substrate.

According to another embodiment of the present invention, a device manufacturing method includes providing a first portion of a radiation beam with a linear polarization in a first direction; or providing a first portion of a radiation beam with a linear polarization in a first direction and providing a second portion of the radiation beam with a linear polarization in a second direction, the second direction being substantially perpendicular to the first direction; patterning the radiation beam; and projecting the patterned beam of radiation onto a substrate.

According to a further embodiment of the present invention a device manufactured includes providing a first portion of a radiation beam with a linear polarization in a first direction, or providing a first portion of a radiation beam with a linear polarization in a first direction and providing a second portion of the radiation beam with a linear polarization in a second direction, the second direction being substantially perpendicular to the first direction; patterning the radiation beam; and projecting the patterned beam of radiation onto a target portion of the substrate.

The manufactured device may, for example, be integrated circuits (ICs), integrated optical systems, guidance and detection patterns for magnetic domain memories, liquid crystal displays (LCDs) and thin-film magnetic heads.

BRIEF DESCRIPTION OF THE DRAWINGS

Embodiments of the present invention will now be described, by way of example only, with reference to the accompanying schematic drawings in which corresponding reference symbols indicate corresponding parts, and in which:

FIG. 8 depicts a table representing degree of polarization (DOP) and polarization purity combining both into the intensity in the desired polarized state (IPS) wherein the IPS measures the intensity of the chosen polarization direction;

DETAILED DESCRIPTION

Figure 1:
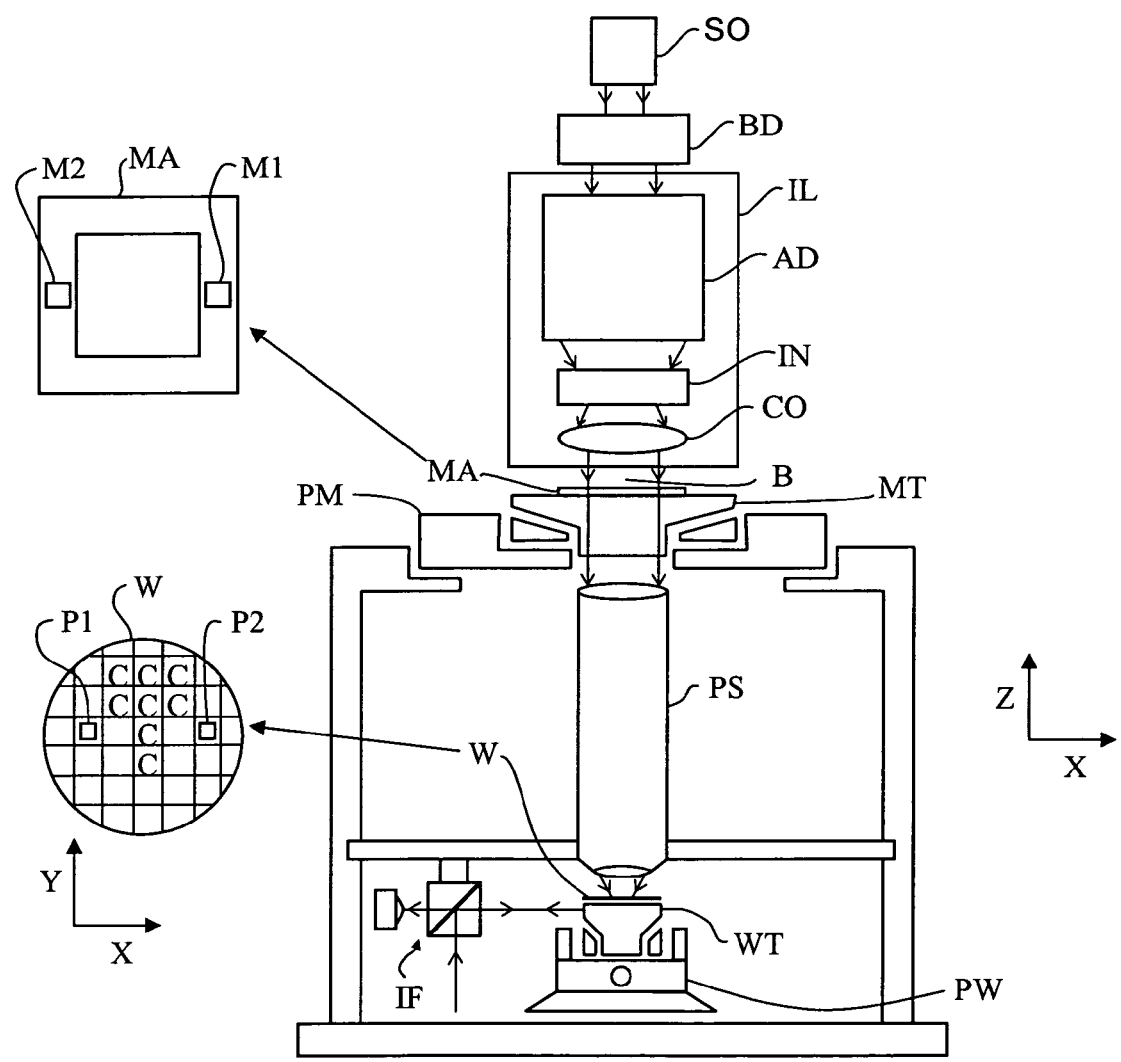
FIG. 1 depicts a lithographic apparatus according to an embodiment of the present invention.

FIG. 1 schematically depicts a lithographic apparatus according to an embodiment of the present invention. The apparatus includes an illumination system (illuminator) IL configured to condition a radiation beam B (e.g. UV radiation or DUV radiation). A support (e.g. a mask table) MT is constructed to support a patterning device (e.g. a mask) MA and is connected to a first positioning device PM configured to accurately position the patterning device in accordance with certain parameters. A substrate table (e.g. a wafer table) WT is constructed to hold a substrate (e.g. a resist-coated wafer) W and is connected to a second positioning device PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory processes may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjusting device AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condensor CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which projects the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1 but which may be an interferometric device, linear encoder, or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height, in the scanning direction, of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Using polarized radiation according to the present invention enhances image contrast. An incremental improvement in exposure latitude (EL), lower mask error enhancement factors (MEEF) and reduced line-edge roughness may also be obtained.

A problem which exists in the art is that due to polarization induced compaction, birefringence is burnt into fused silica material forming part of an illumination system. It has been found that if the polarization orientation is not parallel or orthogonal to the birefringence orientation, the polarization orientation is changed, thus leading to critical dimension (CD) errors. It has therefore been found that a mix of polarization states which are not substantially perpendicular to one another as set out in the present invention is limiting to the lifetime of an illumination system.

The present invention therefore relates to forming linearly polarized radiation, polarized in a first direction or polarized in the first direction and a second direction, the second direction being substantially perpendicular to the first direction. The last type of radiation, as previously stated may generally be referred to as XY polarized radiation. In particular, the present invention relates to using an annular illumination mode with radiation polarized in a first and second direction. The first direction of polarization may be either parallel or perpendicular with the scanning direction. In this application the first direction is referred to as X-direction, the second direction as Y-direction.

Figure 2:
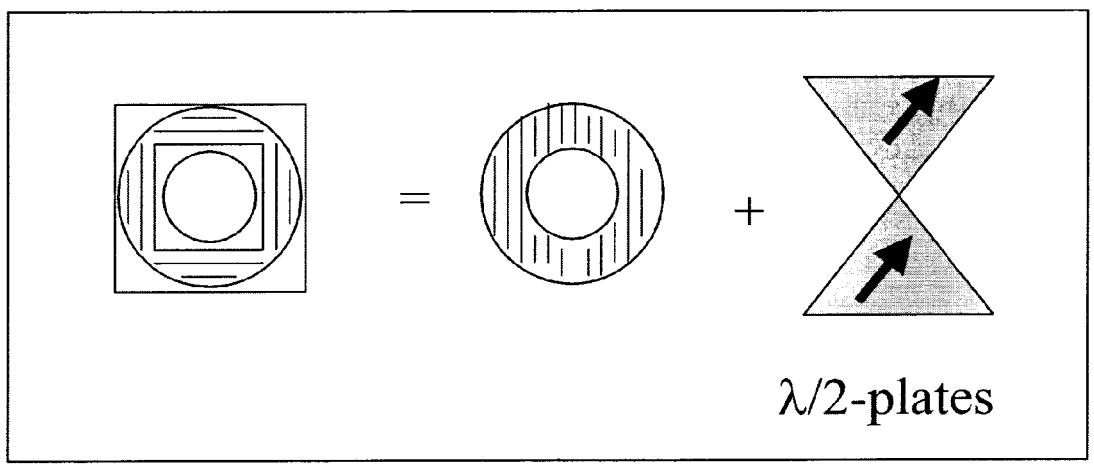
FIG. 2 depicts the conversion of linear polarization in an annular illumination mode with two half-wavelength plates into polarized light in a first and second direction substantially perpendicular to one another according to an embodiment of the present invention.

As shown in FIG. 2, annular illumination with radiation in first and second directions is formed, the first and second directions being substantially perpendicular to each other. The ratio between the first and second directions of polarized radiation is 1:1. At least 95% of the radiation is polarized in either the first and second directions.

Figure 3A:
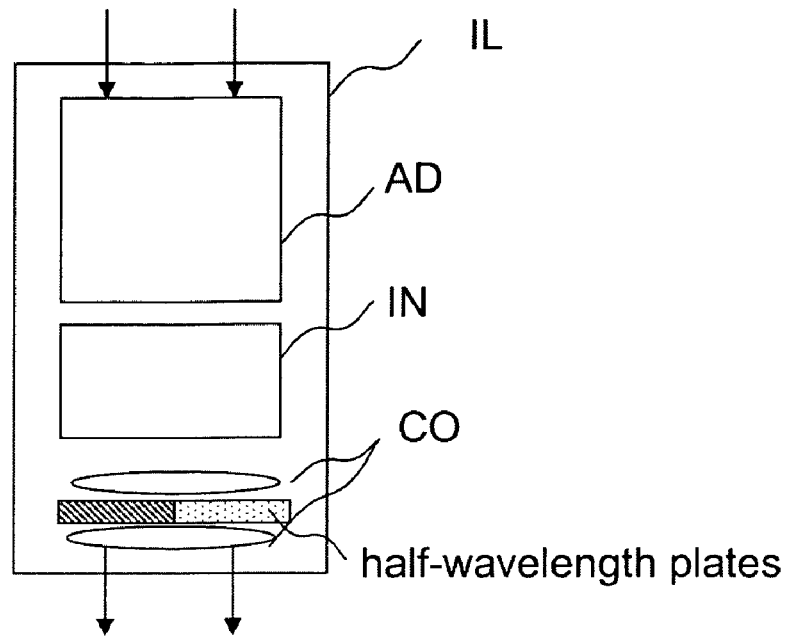
FIGS. 3a-3c depict the arrangement of two half-wavelength plates in the apparatus according to embodiments of the present invention.
Figure 3B:
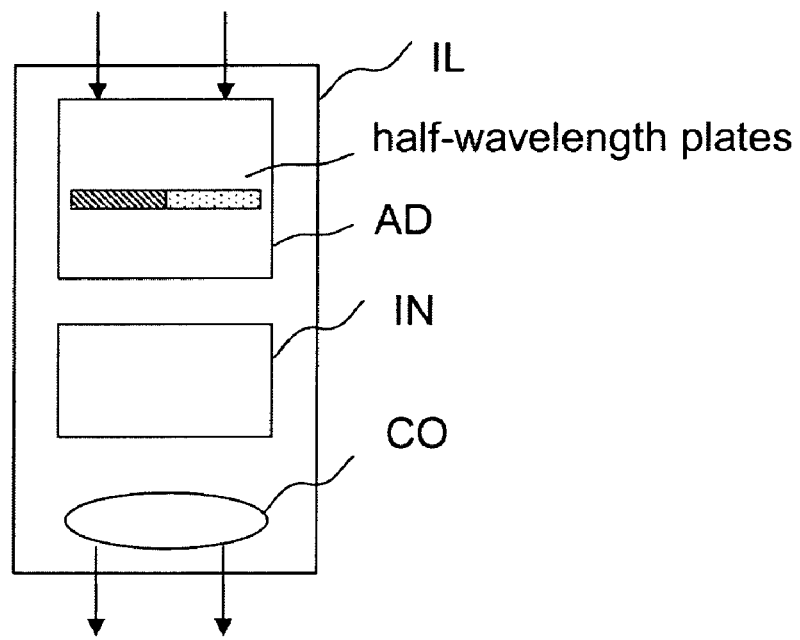
Figure 3C:
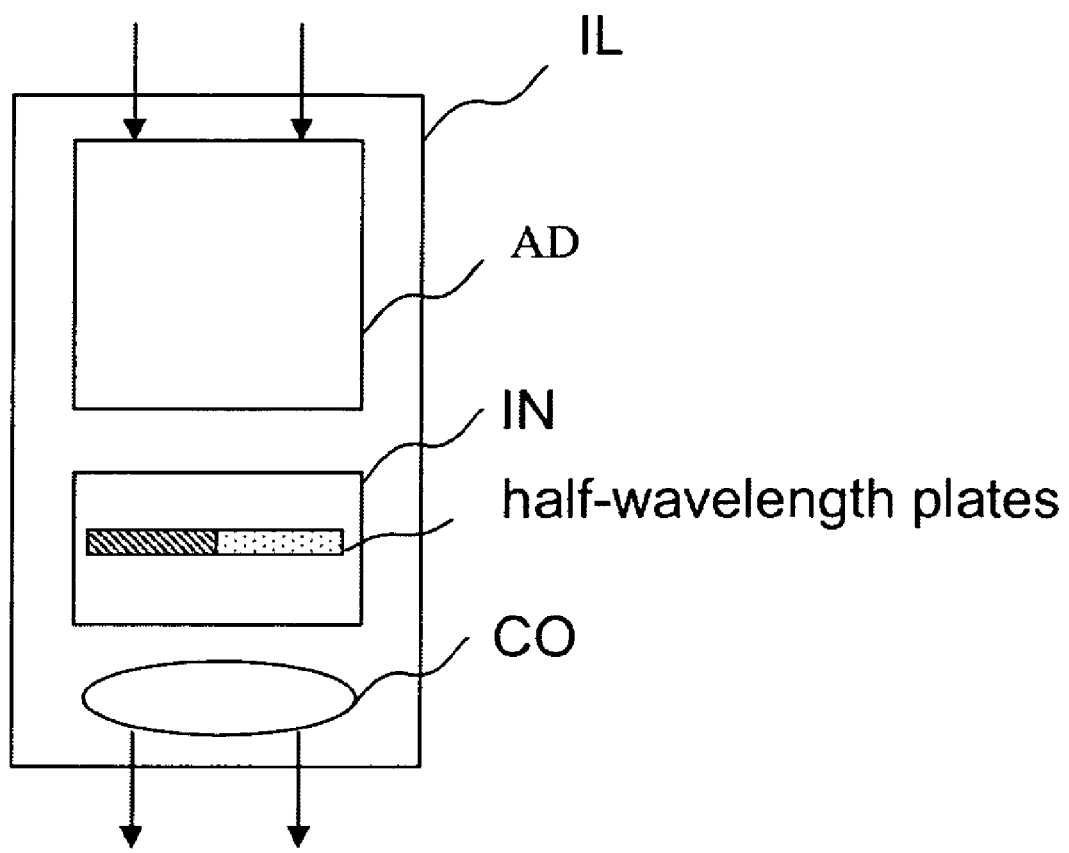

FIG. 3a depicts two half-wavelength plates (i.e. the rotator) in the condensor CO of the apparatus according to the present invention. FIG. 3b depicts the two half-wavelength plates (i.e. the rotator) in the adjusting device AD. FIG. 3c depicts the two half-wavelength plates in the integrator IN.

Figure 4:
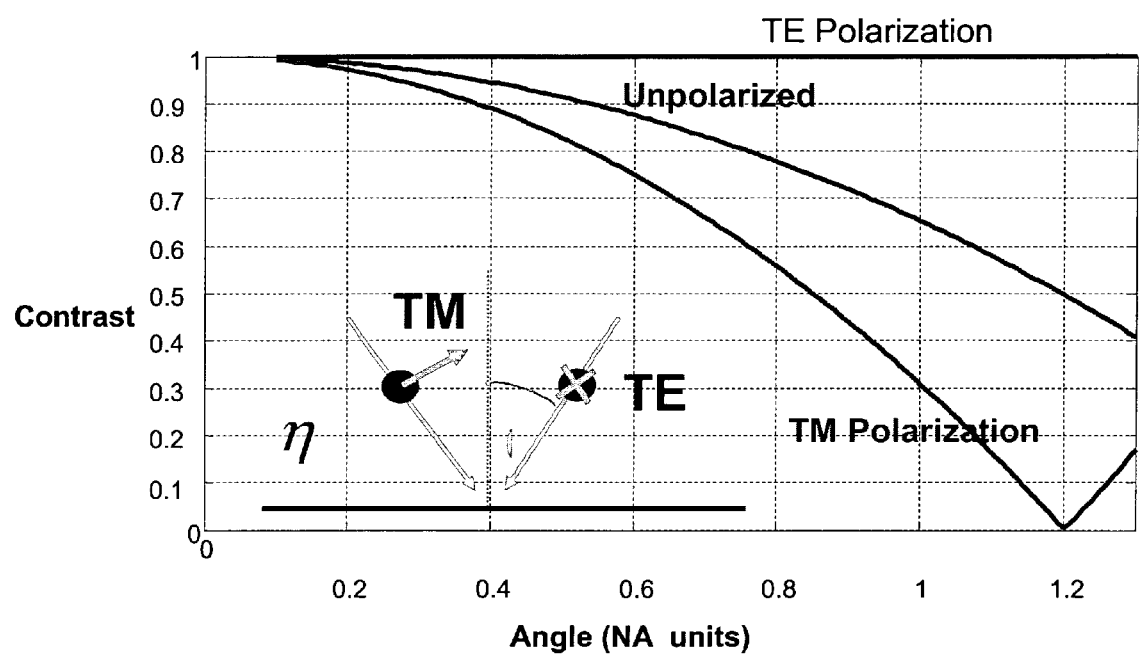
FIG. 4 depicts the effects of polarization which shows that image contrast is increased by maximizing the fraction of TE polarized light according to an embodiment of the present invention.

FIG. 4 depicts the effects of polarization which shows that having a high numerical aperture NA has significant imaging polarization effects. FIG. 4 shows that for TE (transverse electric) polarization the image contrast does not decrease with increasing numerical aperture NA. However, FIG. 4 shows that for unpolarized and TM (transverse magnetic) polarization, there is a reduction in the image contrast with increasing numerical aperture NA. FIG. 4 therefore shows that there may be an improvement in the image contrast and mask error factor (MEF) improvements when using TE polarization.

Figure 5:
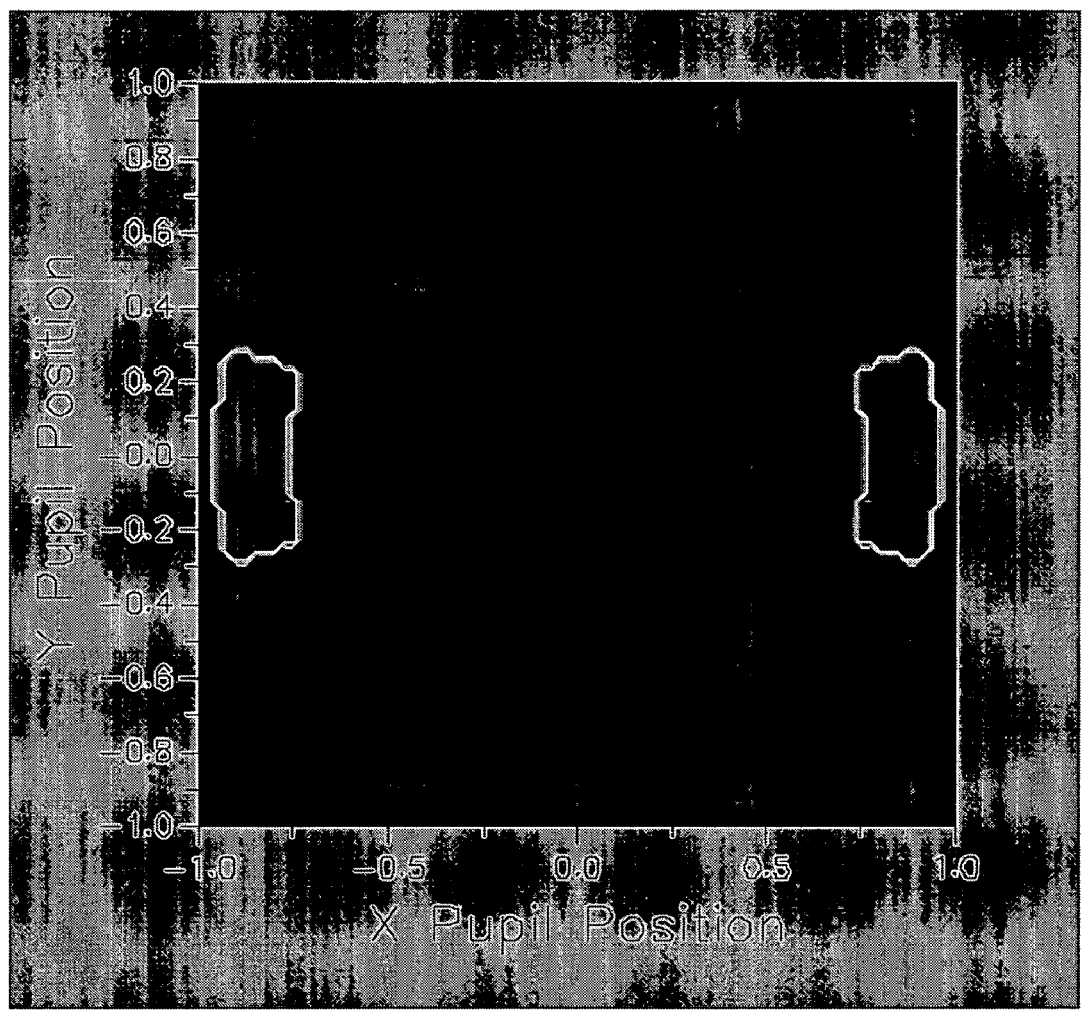
FIG. 5 depicts an image of the polarized light in a dipole illumination according to an embodiment of the present invention.

FIG. 5 represents a pupil image for a dipole illumination mode according to an embodiment of the present invention using an attenuated phase shift mask (att-PSM).

Figure 6:
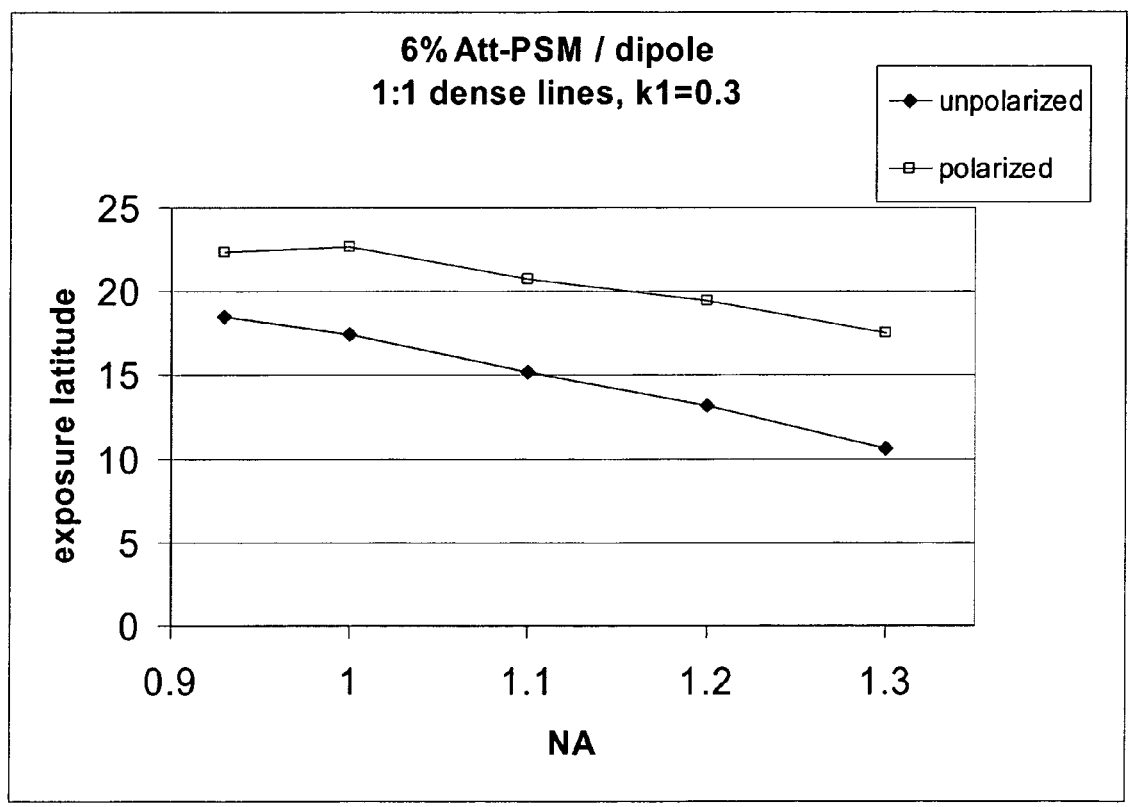
FIG. 6 depicts exposure latitude (EL) versus numerical aperture (NA) for an attenuated phase shift mask for unpolarized and polarized radiation wherein for both polarized and unpolarized radiation the dipole illumination of FIG. 5 is used, the polarization direction chosen to be parallel to the Y direction of the Figure.

FIG. 6 shows that the exposure latitude (EL) is higher for polarized light in comparison to unpolarized light. For both the polarized and unpolarized light the dipole of FIG. 5 is used, the polarization direction being chosen to be parallel to the Y direction of FIG. 5.

Figure 7A:
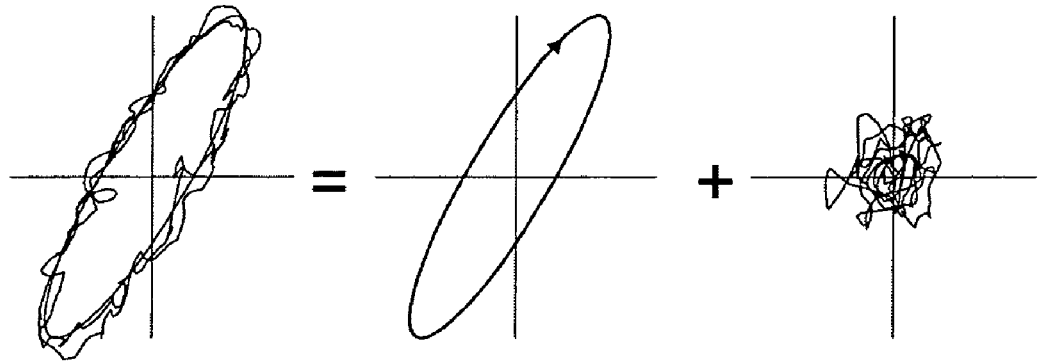
FIGS. 7a and 7b depict diagrams representing degree of polarization (DOP) and polarization purity (PP)
Figure 7B:
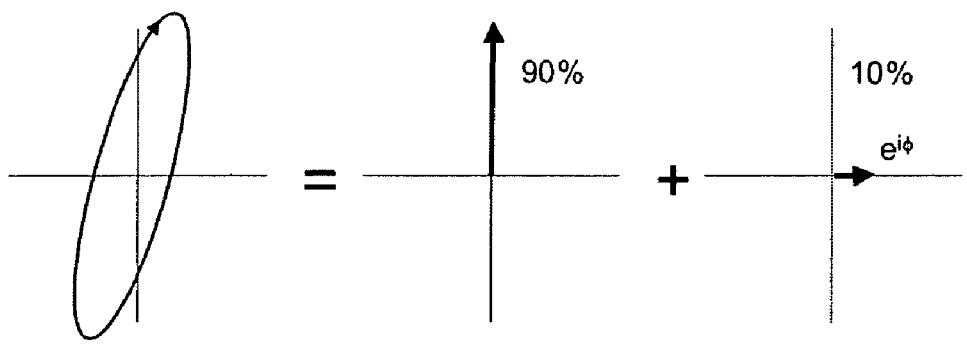

FIGS. 7a and 7b are general representations which illustrate the description of polarized light. The quality of polarized light can be defined using two values. Firstly, the degree of polarization DOP may be used to quantify the polarized light which describes the fraction of light which is polarized. Secondly, polarization purity PP which relates to the fraction of the polarized light in the correct direction may also be used.

FIG. 8 represents a table for different polarization situations with different degrees of polarization and polarization purity PP. In the table, the degree of polarization DOP and polarization purity PP are combined to form an intensity in the desired polarized states IPS. The IPS measures the intensity of the chosen polarization direction.

Figure 9:
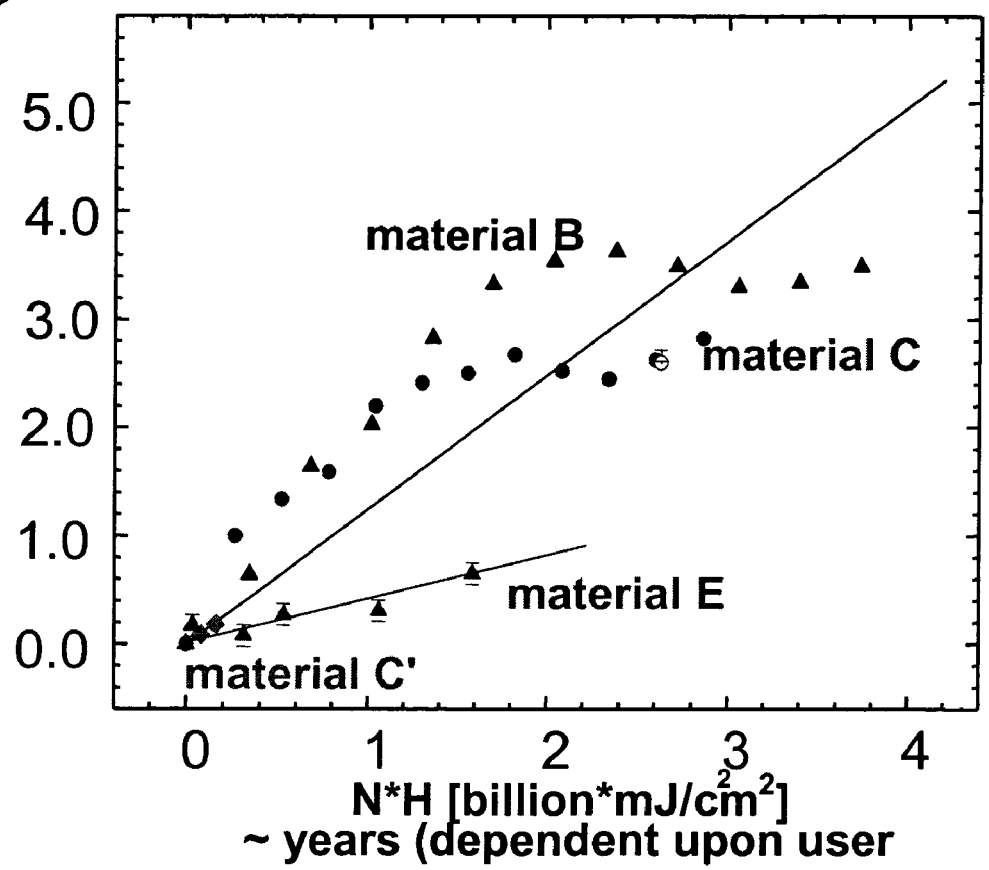
FIG. 9 depicts a graph of birefringence versus lifetime for different illuminator materials according to an embodiment of the present invention.

FIG. 9 depicts a graph of birefringence versus lifetime in years for different illuminator materials using polarized irradiation. It shows fused silica degradation (i.e. birefringence burn in) as a function of different material grades.

Figure 10:
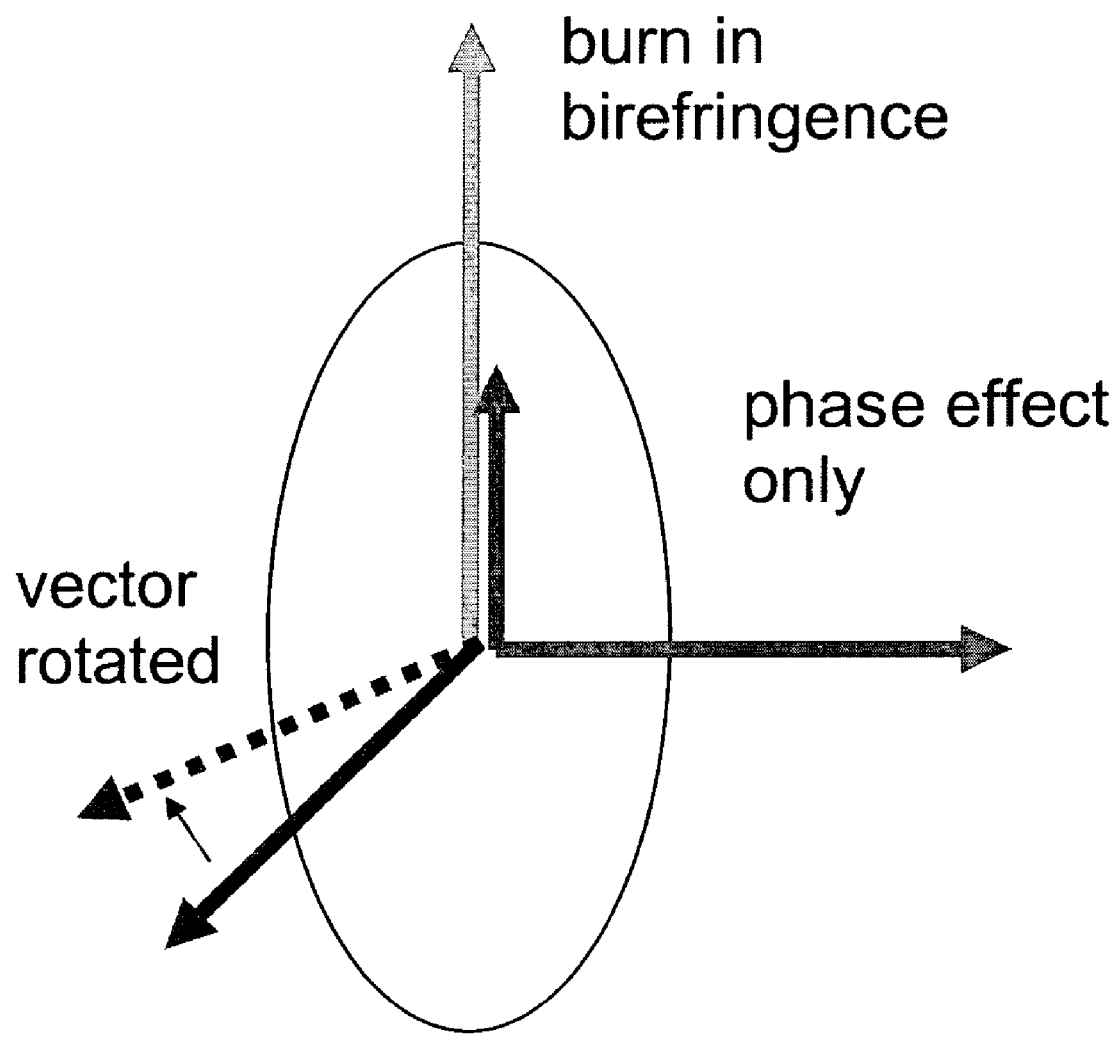
FIG. 10 depicts burn in birefringence with X-polarized light.

FIG. 10 depicts the burn in birefringence with X-polarized light.

Figure 11:
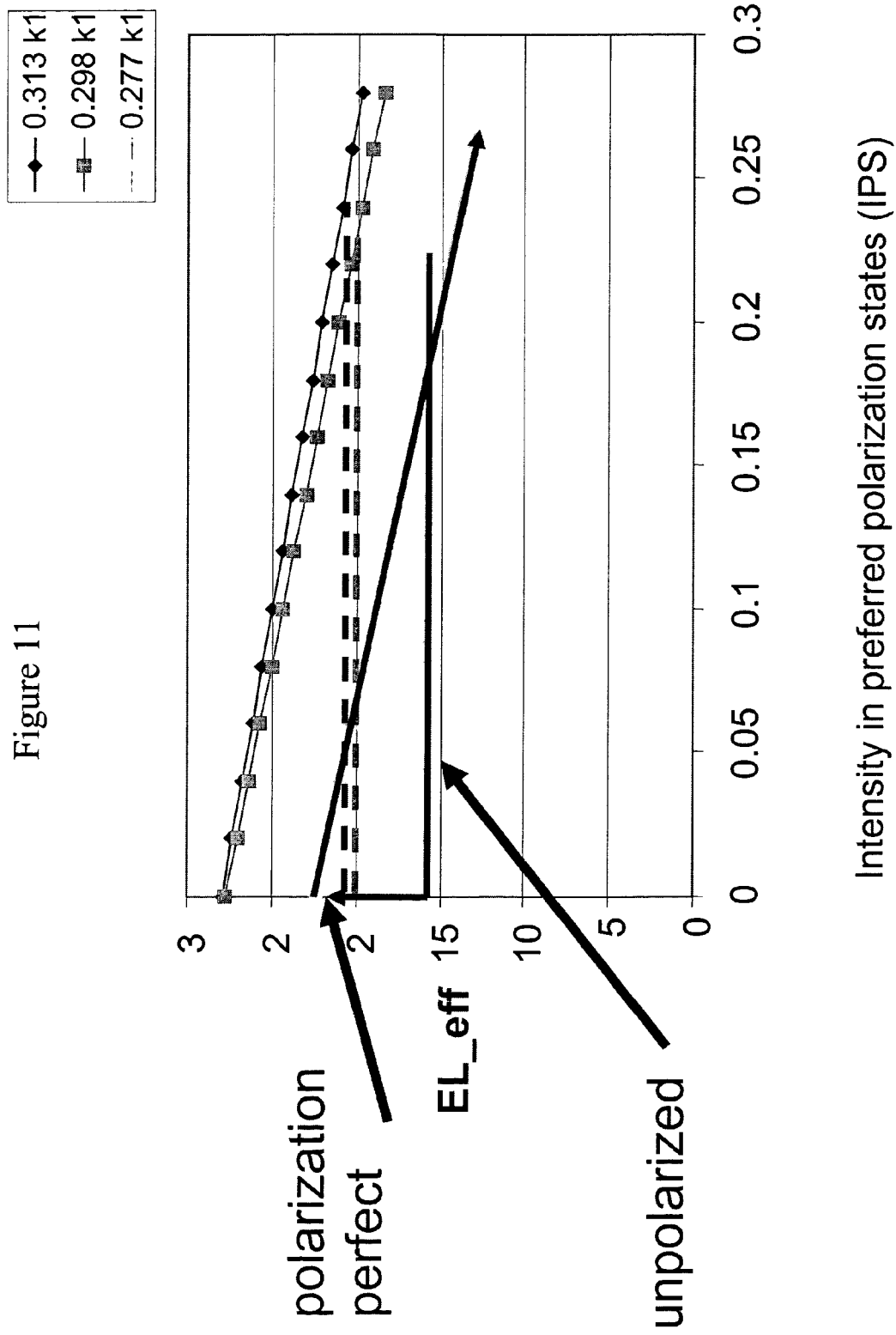
FIG. 11 depicts how a variation in IPS impacts exposure latitude (EL)

FIG. 11 depicts how a variation in IPS impacts the exposure latitude. For perfect polarization (IPS variation=0) there is a certain gain in EL by using polarization. When there is an IPS variation across the image field, then per field point a different absolute energy is needed to expose a feature. This leads to overlapping exposure windows of all field points being smaller than the maximum gain without variation.

Figure 12:
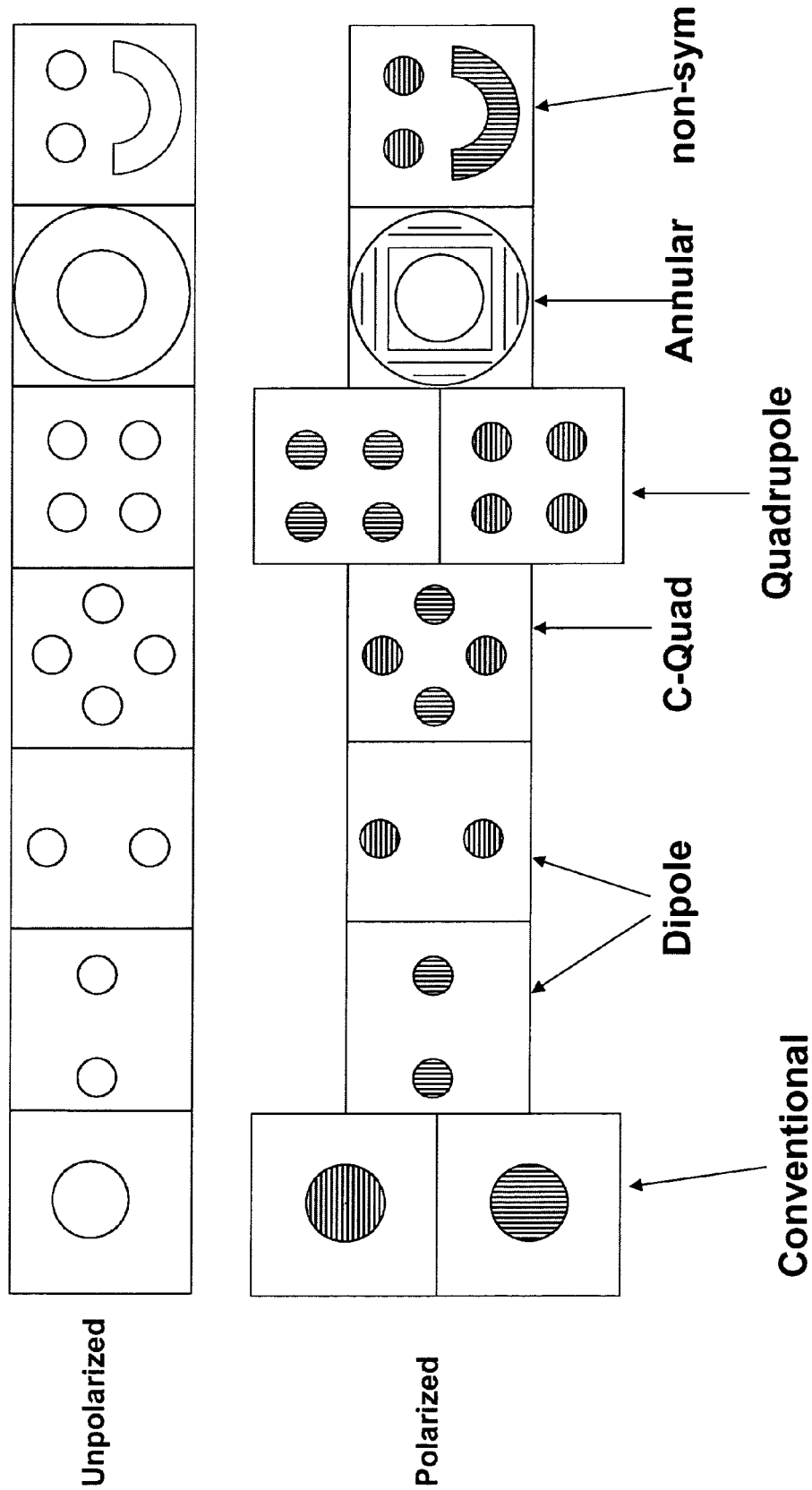
FIG. 12 depicts various illumination modes according to embodiments of the present invention.

FIG. 12 depicts different illumination modes according to the present invention such as conventional, dipole, quadrupole, annular and non-symmetric. The conventional illumination mode has a linear polarization directed in either a first direction, X-direction or in a second direction, Y-direction, perpendicular to the first direction. The dipole illumination mode has two illumination poles located on axis in the X-direction, whereby the direction of linear polarization of the illumination poles is parallel to the Y-direction. The other dipole mode has two illumination poles located on an axis in the Y-direction, whereby the direction of linear polarization of the illumination poles is parallel to the X-direction. C-Quad has four illumination poles arranged in a square, whereby an axis through two opposite poles is parallel to the X- or Y-direction and the direction of linear polarization of the illumination of two poles on an axis parallel to the X-direction is directed parallel to the Y-direction and the direction of linear polarization of the illumination of the two poles on an axis parallel to the Y-direction is directed parallel to the X-direction. Furthermore, FIG. 12 shows a quadrupole illumination mode, whereby an axis trough two opposite poles is under 45° with the X- or Y-direction and the linear polarization of the illumination of the poles is either parallel to the X-direction or parallel to the Y-direction. Two different configurations for quadrupole illumination are shown, one configuration is X polarized and the other is Y polarized. Furthermore, FIG. 12 shows an annular illumination mode, wherein the ring is divided in four portions and the direction of the linear polarization of the illumination of two opposite portions is parallel to the X- or Y-direction, and the direction of the linear polarization of two adjacent portions is mutual perpendicular. FIG. 12 also shows an example of an irregular illumination mode including a semi-annular portion having a direction of linear polarization parallel to the X-direction and two poles on an axis parallel to the Y-direction, the direction of the polarization of the illumination of the two poles is parallel to the Y-direction.

Figure 13:
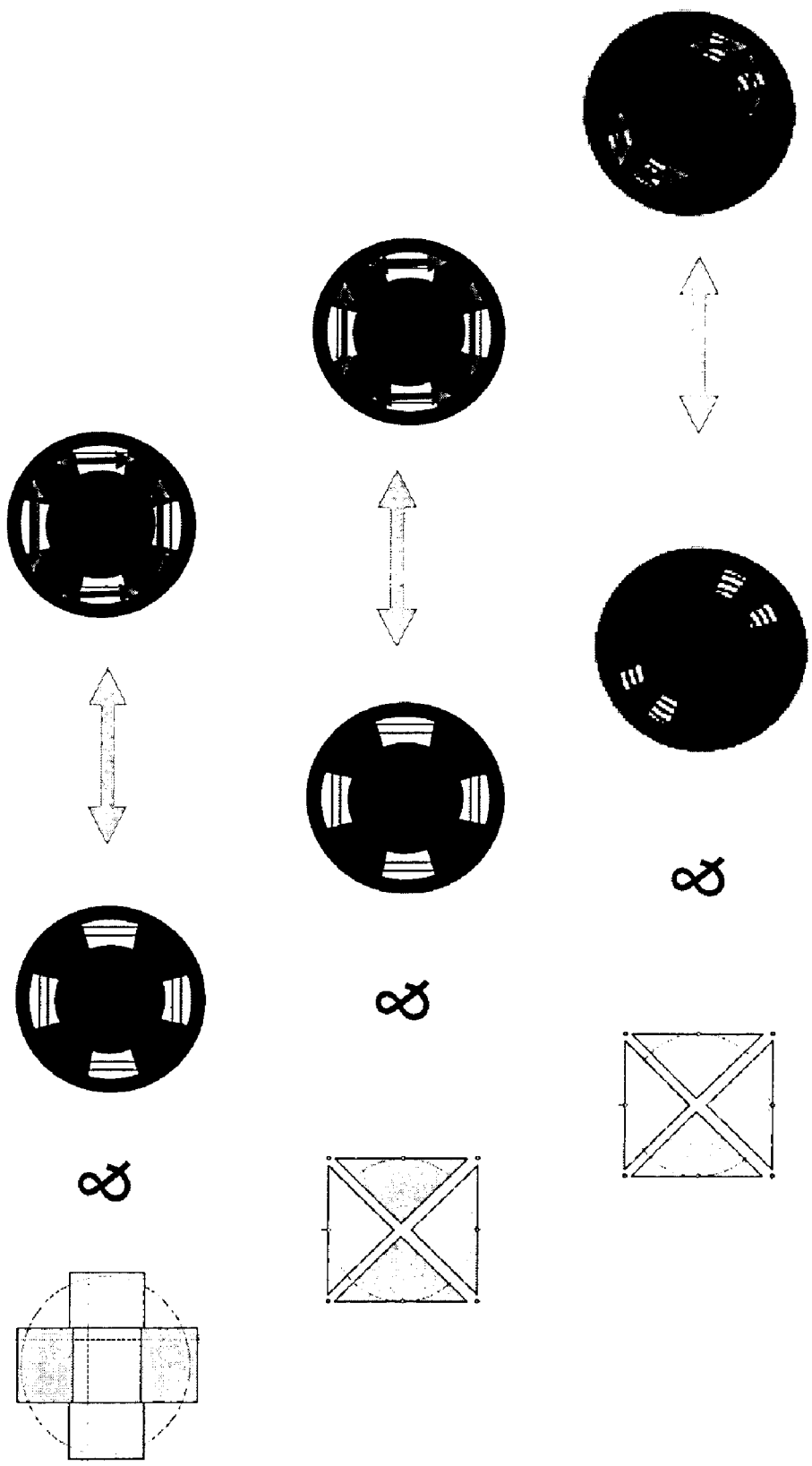
FIG. 13 depicts further illumination modes according to embodiments of the present invention.

FIG. 13 represents further possible illumination modes. C-Quad, Quasar™ and a custom illumination mode are shown.

Figure 14:
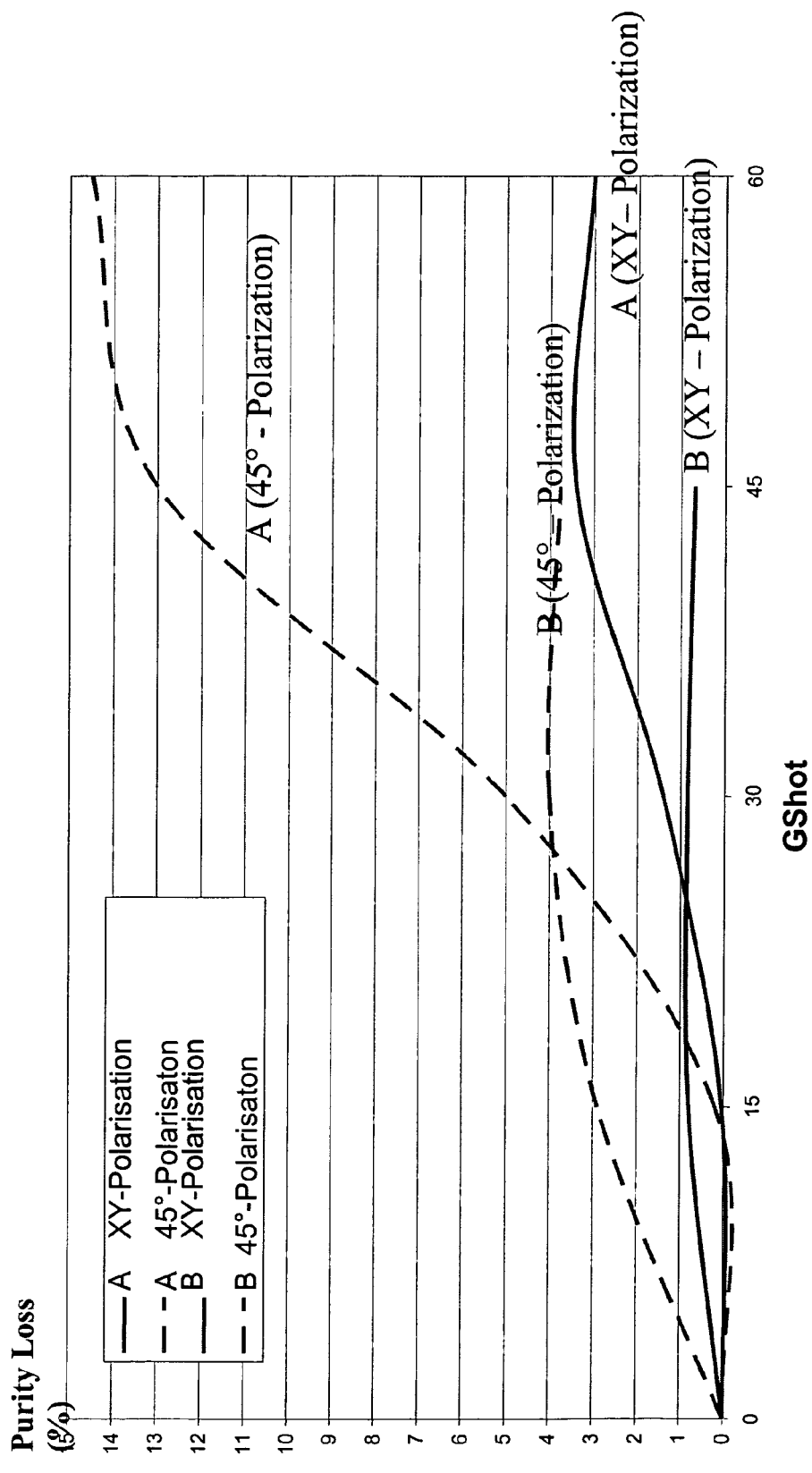
FIG. 14 depicts polarization lifetime effects for polarized light according to embodiments of the present invention and lifetime effects for conventional illumination with polarized light having a polarization direction making an angle of 45° with respect to the scanning direction.

FIG. 14 depicts polarization lifetime effects for illuminator materials A and B irradiated with XY polarization according to the present invention (i.e. the radiation is polarized in a first and second direction, the second direction being substantially perpendicular to the first) and lifetime effects for conventional illumination with polarized light having a polarization direction making an angle of 45° with respect to the scanning direction. FIG. 14 shows that using XY polarization that there is a significant reduction in the purity loss of the efficiency in the illuminator material i.e. the lifetime of the illumination system is increased. Two different silica types (A and B) are shown for the loss in polarization purity for 45° polarization which is the worst case. In comparison to using XY polarization, there is an improvement of a factor of 5 in the lifetime of the illumination system when using XY polarization. It is clear that when using 45° polarization that the illumination system has a lifetime of less than $20\times10^9$ shots (i.e. 20 G shots) and using XY polarization the illumination system has a lifetime of greater than about $35\times10^9$ shots (i.e. 35 G shots) and preferably greater than about $100\times10^9$ shots (i.e. 100 G shots). For example, material B in FIG. 14 is shown to saturate at a very low induced birefringence level. It should be noted that the data shown in FIG. 14 are subject to change due to advances in material improvements, change of simulation conditions and thus are merely meant as educative and illustrative.

Figure 15:
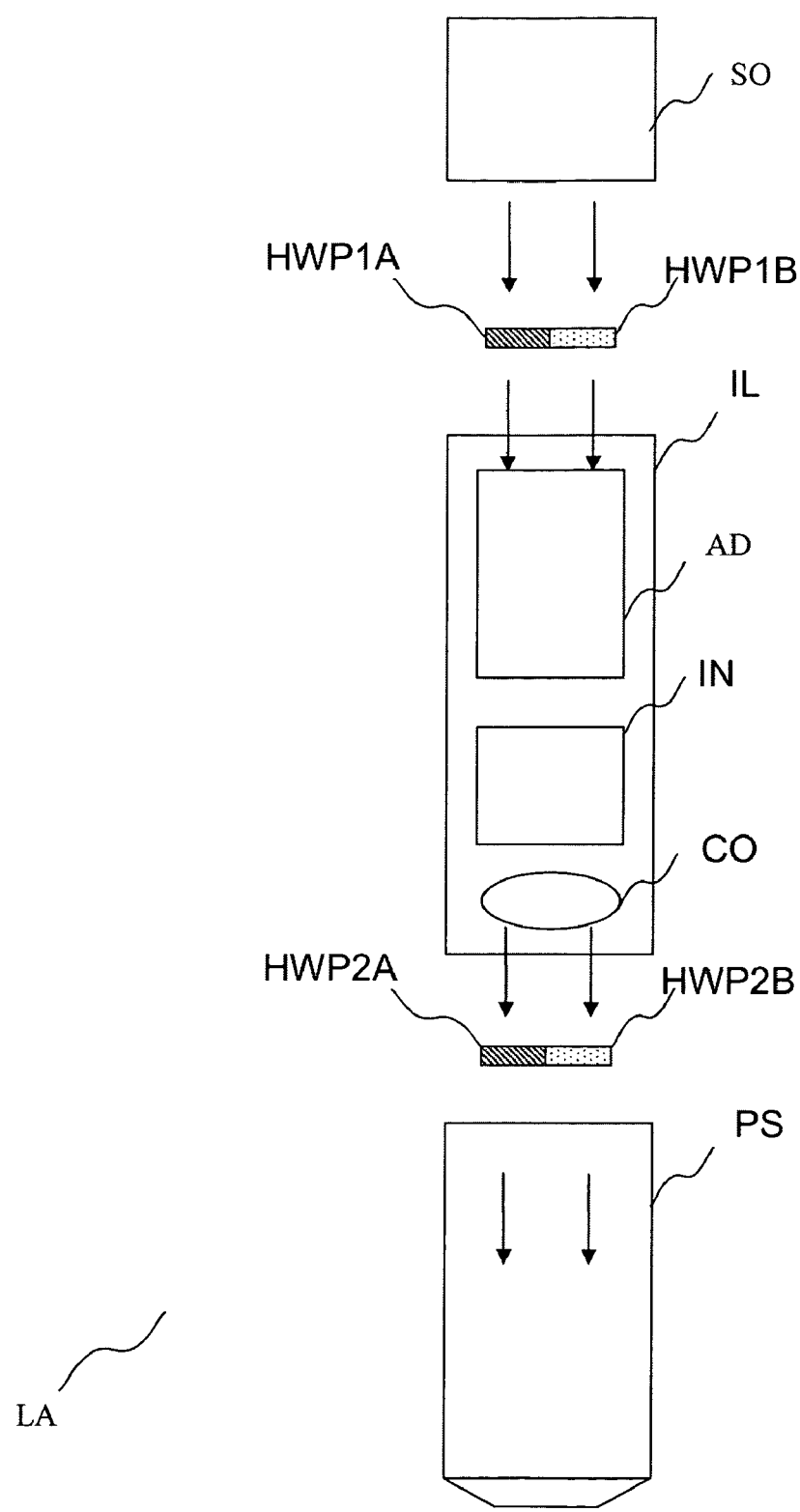
FIG. 15 depicts the arrangement of two half-wavelength plates and two further half-wavelength plates in the apparatus according to an embodiment of the present invention.

FIG. 15 shows a further embodiment of a lithographic apparatus. The lithographic apparatus LA includes a radiation source SO, an optical active element, for example a half-wave plate HWP1A, HWP1B, an illumination system IL and a further optical active element, for example a half-wave plate HWP2A, HWP2B and a projection system PS. In operation, the radiation source SO emits a radiation beam to the illumination system IL, whereby a first portion of the radiation beam is transmitted via the half-wave plate HWP1A, and a second portion of the radiation beam is transmitted via the half-wave plate HWP1B in order to bring about a radiation beam having an XY polarization.

The illumination system IL adapts the cross-section and the intensity distribution of the radiation beam and transmits the radiation beam to the projection system PS via the further optical active element, for example a half-wave plate HWP2A, HWP2B. The half-wave plate HWP2A changes the direction of the polarization of the first portion of the beam in a different direction and the half-plate HWP2B changes the direction of polarization of the second portion of the beam in a further different direction. Using half-wave plate HWP2A, HWP2B the polarization direction of the first and second portion of the beam can be set to optimize the exposure latitude for non-vertical and non-horizontal patterns while leaving the polarization in the illuminator unchanged for maximizing the illuminator lifetime. Instead of a half-wave plate HWP2A,HWP2B a quarter-wave plate can be used for the further optical element between the illumination system IS and the projection system PS. In this embodiment the quarter-wave plates transfers the linear polarization of the first and second portion of the radiation beam into a circular polarization with respectively a levorotary and a dextrorotary direction of the first and second portions. Furthermore, the optical active element can be a depolarizer.

In summary, the present invention relates to using polarized light to improve the imaging properties, for example the exposure latitude, while maintaining and extending the lifetime of an illumination system in a lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the invention may be practiced otherwise than as described. For example, the present invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the present invention as described without departing from the scope of the claims set out below.

What is claimed is:

1. A lithographic apparatus, comprising:
an illumination system configured to condition a radiation beam and to provide multiple poles, the poles configured to maximize the amount of diffracted radiation within a lens pupil and having, per pole, a choice of polarized radiation in either a first or a second direction to maximize the content of transverse electric polarization;
a support constructed to support a patterning device, the patterning device being configured to impart the radiation beam with a pattern in its cross-section to form a patterned radiation beam;
a substrate table constructed to hold a substrate;
a projection system configured to project the patterned radiation beam onto a target portion of the substrate,
wherein the lithographic apparatus comprises an optical element, the optical element being configured to provide a first portion of the radiation beam with a linear polarization in the first direction, or to provide a first portion of the radiation beam with a linear polarization in the first direction and a second portion of the radiation beam with a linear polarization in the second direction, the second direction being perpendicular to the first direction.

2. A lithographic apparatus according to claim 1, wherein the optical element is located between the radiation source and the illumination system.

3. A lithographic apparatus according to claim 1, wherein the substrate table is movable in a scanning direction with respect to the patterning device, and the first direction of polarization is perpendicular or parallel to the scanning direction.

4. A lithographic apparatus according to claim 1, wherein the illumination system is configured to provide segmented point-symmetric illumination modes and/or non-symmetric illumination modes.

5. A lithographic apparatus according to claim 1, wherein the illumination system is configured to provide dipole, a-symmetric, quadrupole, and hexa-pole illumination.

6. A lithographic apparatus according to claim 1, wherein the optical element comprises two half-wavelength plates.

7. A lithographic apparatus according to claim 1, wherein at least 95% of the radiation beam is polarized into either the first or second directions.

8. A lithographic apparatus according to claim 2, wherein the lithographic apparatus is provided with a further optical element located between an illuminator and the projection system, the further optical element being configured to change the polarization state of the first portion of the radiation beam into a polarization state different from the polarization state of the radiation beam before entering the optical element.

9. A lithographic apparatus according to claim 8, wherein the further optical element comprises a half-wavelength plate.

10. A lithographic apparatus according to claim 8, wherein the further optical element comprises a quarter-wavelength plate.

11. A lithographic apparatus according to claim 8, wherein the further optical element comprises a depolarizer.

12. A lithographic apparatus according to claim 6, wherein the half-wavelength plates are substantially triangular in shape.

13. A lithographic apparatus according to claim 6, wherein the two half-wavelength plates are in a condensor, an adjusting device or an integrator of the lithographic apparatus.

14. A lithographic apparatus according to claim 6, wherein the two half-wavelength plates are both placed in a condensor of the lithographic apparatus.

15. A lithographic apparatus according to claim 6, wherein the two half-wavelength plates are both placed in an adjusting device of the lithographic apparatus.

16. A lithographic apparatus according to claim 6, wherein the two half-wavelength plates are both placed in an integrator of the lithographic apparatus.

17. A lithographic apparatus according to claim 6, wherein the two half-wavelength plates are placed in or near a pupil plane of a condensor of the lithographic apparatus.

18. A lithographic apparatus according to claim 6, wherein the two half-wavelength plates are placed in or near the pupil plane of an adjusting device of the lithographic apparatus.

19. A lithographic apparatus according to claim 6, wherein the two half-wavelength plates are placed in or near the pupil plane of an integrator of the lithographic apparatus.

20. A lithographic apparatus according to claim 6, wherein the two half-wavelength plates are formed from quartz silica.

21. A lithographic apparatus according to claim 1, wherein a lifetime of the illumination system is at least about $30 \times 10^9$ shots.

22. A lithographic apparatus according to claim 1, wherein the projection system has a numerical aperture greater than about 1.0.

23. A lithographic apparatus according to claim 1, wherein at least part of the lithographic apparatus is immersed in an immersion fluid.

24. A lithographic apparatus according to claim 23, wherein the immersion fluid is water.

25. A device manufacturing method, comprising:
providing a radiation beam with multiple poles, the poles configured to maximize the amount of diffracted radiation within a lens pupil;
providing a first portion of the radiation beam with a linear polarization in a first direction, or providing a first portion of the radiation beam with a linear polarization in a first direction and a second portion of the radiation beam with a linear polarization in a second direction, the second direction being substantially perpendicular to the first direction, and having, per pole, a choice of polarized radiation in either the first or the second direction to maximize the content of transverse electric polarization;
imparting a pattern to the radiation beam; and
projecting the patterned beam of radiation onto a target portion of a substrate.

* * * * *